US009806026B2

(12) United States Patent
Huang et al.

(10) Patent No.: US 9,806,026 B2
(45) Date of Patent: Oct. 31, 2017

(54) SELF REPAIRING PROCESS FOR POROUS DIELECTRIC MATERIALS

(71) Applicant: Taiwan Semiconductor Manufacturing Co., Ltd., Hsin-Chu (TW)

(72) Inventors: Tsung-Min Huang, Taichung (TW); Chung-Ju Lee, Hsinchu (TW); Tien-I Bao, Dayuan Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 67 days.

(21) Appl. No.: 14/708,503

(22) Filed: May 11, 2015

(65) Prior Publication Data

US 2015/0243603 A1 Aug. 27, 2015

Related U.S. Application Data

(62) Division of application No. 13/531,738, filed on Jun. 25, 2012, now Pat. No. 9,029,171.

(51) Int. Cl.
*H01L 21/70* (2006.01)
*H01L 23/532* (2006.01)
(Continued)

(52) U.S. Cl.
CPC .... *H01L 23/5329* (2013.01); *H01L 21/02126* (2013.01); *H01L 21/02203* (2013.01);
(Continued)

(58) Field of Classification Search
CPC ......... H01L 21/02126; H01L 21/02107; H01L 21/02109; H01L 21/02203
(Continued)

(56) References Cited

U.S. PATENT DOCUMENTS

| 6,879,046 B2 * | 4/2005 | Gibson, Jr. ....... H01L 21/02126 174/256 |
| 7,553,769 B2 | 6/2009 | Toma et al. |

(Continued)

FOREIGN PATENT DOCUMENTS

| CN | 1755902 A | 4/2006 |
| CN | 101312129 A | 11/2008 |

(Continued)

OTHER PUBLICATIONS

Non-Final Office Action dated Apr. 11, 2014 for U.S. Appl. No. 13/531,738.
(Continued)

*Primary Examiner* — Kenneth Parker
*Assistant Examiner* — John Lin
(74) *Attorney, Agent, or Firm* — Eschweiler & Potashnik, LLC

(57) ABSTRACT

The present disclosure relates to a structure and method to create a self-repairing dielectric material for semiconductor device applications. A porous dielectric material is deposited on a substrate, and exposed with treating agent particles such that the treating agent particles diffuse into the dielectric material. A dense non-porous cap is formed above the dielectric material which encapsulates the treating agent particles within the dielectric material. The dielectric material is then subjected to a process which creates damage to the dielectric material. A chemical reaction is initiated between the treating agent particles and the damage, repairing the damage. A gradient concentration resulting from the consumption of treating agent particles by the chemical reaction promotes continuous diffusion the treating agent particles towards the damaged region of the dielectric material, continuously repairing the damage.

20 Claims, 4 Drawing Sheets

(51) Int. Cl.
    *H01L 21/768*    (2006.01)
    *H01L 21/02*     (2006.01)
    *H01L 21/3105*   (2006.01)
    *H01L 23/528*    (2006.01)

(52) U.S. Cl.
    CPC .... *H01L 21/02321* (2013.01); *H01L 21/3105* (2013.01); *H01L 21/76814* (2013.01); *H01L 21/76826* (2013.01); *H01L 23/528* (2013.01); *H01L 2924/0002* (2013.01)

(58) Field of Classification Search
    USPC ........................................................ 257/506
    See application file for complete search history.

(56) References Cited

U.S. PATENT DOCUMENTS

2005/0077597 A1* 4/2005 Toma ............... H01L 21/02063
                                                          257/629
2006/0057837 A1   3/2006 Bhanap et al.
2007/0249156 A1  10/2007 Bonilla et al.
2009/0311859 A1* 12/2009 Bonilla ............. H01L 21/02074
                                                          438/637
2010/0304566 A1  12/2010 Fischer et al.

FOREIGN PATENT DOCUMENTS

| KR | 20060126933 A | 12/2006 |
| KR | 20070060117 A | 6/2007 |
| TW | 200428632 | 12/2004 |
| TW | 200522141 | 7/2005 |
| WO | 2006049595 A1 | 5/2006 |

OTHER PUBLICATIONS

Notice of Allowance dated Jan. 14, 2015 for U.S. Appl. No. 13/531,738.

* cited by examiner

300A

| Sample | Description |
|---|---|
| S1 (602) | Untreated dielectric film |
| S2 (604) | Etched dielectric film with damage |
| S3 (606) | Self-repairing dielectric film |
| S4 (608) | Externally-repaired dielectric film |

SELF REPAIRING PROCESS FOR POROUS DIELECTRIC MATERIALS

REFERENCE TO RELATED APPLICATION

This application is a Divisional of U.S. application Ser. No. 13/531,738 filed on Jun. 25, 2012, and the contents of which are incorporated by reference in their entirety.

BACKGROUND

The scaling of semiconductor feature sizes according to Moore's Law has driven a need for improved material properties to achieve a desired integrated circuit performance. Some aspects of integrated circuit performance may be enhanced through the utilization of a dielectric material with a low dielectric constant for electrical isolation of metallization levels. The processing steps required to manufacture the various components of an integrated circuit can degrade the properties of the dielectric material, reducing yield. As such, efficient repair mechanisms are desired.

DETAILED DESCRIPTION

Figure 1A:
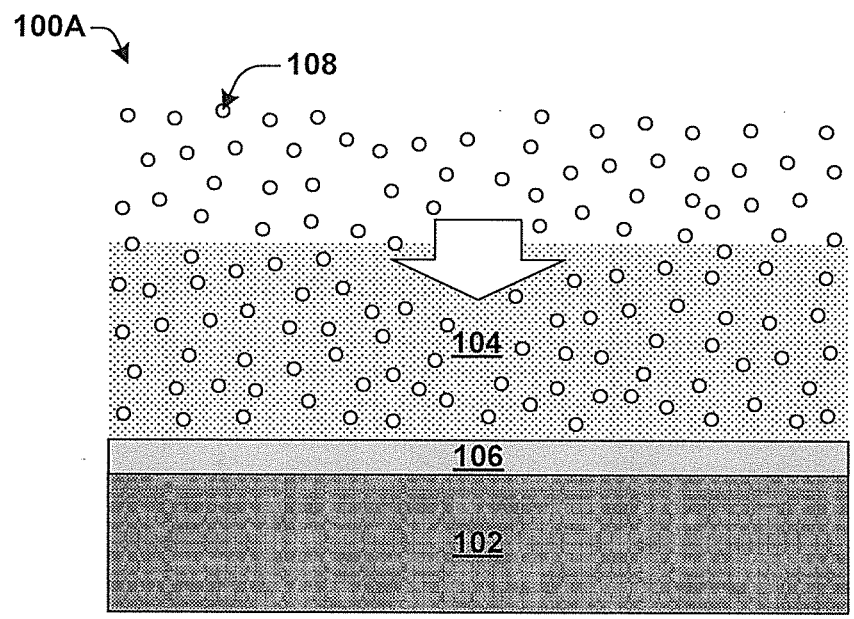
FIG. 1A-FIG. 2B illustrate some embodiments of a self-repairing dielectric material.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Semiconductor manufacturing involves a series of photolithography steps, wherein a semiconductor workpiece, comprising a dielectric material on a silicon substrate, is coated with photoresist, aligned with a patterning mask, and exposed to a radiation source. The radiation creates a pattern of developed photoresist corresponding to the open regions of the photomask. The semiconductor workpiece is then subjected to an etch process, which creates openings in the dielectric material. The etch process may also introduce damage to the dielectric material, the damage comprising a reduction in a concentration of carbon containing moieties near a surface region of the dielectric material. Electron energy loss spectroscopy (EELS) measurements of damaged dielectric material indicate that the damaged surface region extends to depths of approximately 40 angstroms. This damaged surface region results in a higher interconnect capacitance between metallization layers formed within the dielectric material, which degrades the electrical performance of the metallization layers by introducing additional RC delay. To mitigate some of these effects, the damage may be reacted with treating agent particles to increase the concentration of carbon containing moieties in the damaged surface region of the dielectric material, thus repairing the dielectric material. The treating agent particles react with the damaged surface region by functional chemical group, and do not easily penetrate into the damaged surface region. X-ray Photoelectron Spectroscopy (XPS) measurements indicate the penetration depth of treating agent particles to be less than 20 angstroms. Therefore, the treating agent particles do not diffuse far enough into the dielectric material to completely repair all of the damage. As a result, the RC delay is not completely eliminated.

The scaling of semiconductor feature sizes according to Moore's Law has driven a need for improved material properties to achieve a desired integrated circuit performance. Some aspects of integrated circuit performance may be enhanced through the utilization of a dielectric material for electrical isolation of metallization levels, wherein a dielectric constant (k) of the dielectric material defines an ability of the dielectric material to withstand maintain electrical potential between electrically-isolated metallization levels. The processing steps required to manufacture the various components of an integrated circuit can degrade the properties of the dielectric material, reducing yield. As such, efficient repair mechanisms are desired.

Accordingly, the present disclosure relates to a structure and method to repair damage created in a dielectric material during a manufacturing process. A dielectric material is formed on a substrate, and exposed with treating agent particles such that the treating agent particles diffuse into the dielectric material and form a substantially uniform concentration within the dielectric material. A cap is then formed above the dielectric material to encapsulate the treating agent particles within the dielectric material. The dielectric material is then subjected to a process (e.g., etching, ashing, chemical cleaning, or thermal cycling) which induces damage to the dielectric material. The treating agent particles encapsulated within the dielectric material then diffuse through the dielectric material and react with the damage to repair the dielectric material.

FIG. 1A illustrates some embodiments of a self-repairing dielectric material 100A. A copper metallization layer 102 formed. Above the copper metallization layer 102 a dielectric film 104 is formed, and separated from the copper metallization layer 102 by an etch stop liner 106, which prevents subsequent etch and clean steps within the dielectric film 104 from interacting with the copper metallization layer 102. After a curing step comprising exposure to ultraviolet radiation for a time period of approximately 3 minutes to approximately 6 minutes, the dielectric film 104 is then exposed with treating agent particles 108, which comprises one or more of liquids, vapors, gases, plasmas, supercritical solvents, or combinations thereof. The treating agent particles comprise a treating agent particle size of approximately $C_1$-$C_{18}$. In some embodiments, the formation of the dielectric film 104 and an exposure to treating agent particles 108 is carried out in-situ (i.e., in a single processing chamber) in a single processing step. In other embodiments, the formation of the dielectric film 104 and an exposure to treating agent particles 108 comprises multiple processing steps carried out in a plurality of processing chambers.

Figure 1B:
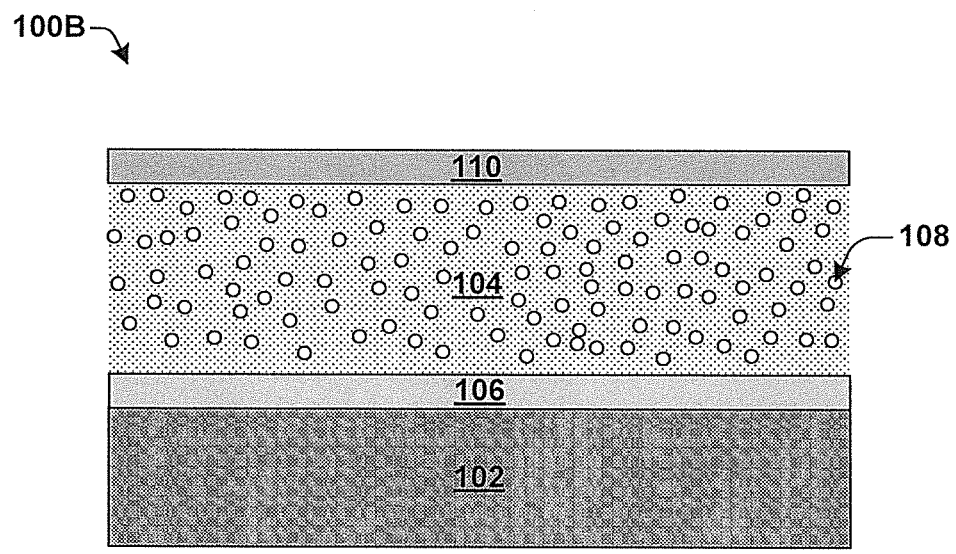

The dielectric film 104 is porous with a pore size ranging from approximately 11 angstroms to approximately 20 angstroms, which is larger than the treating agent particle size of the treating agent particles 108, such that the treating agent particles diffuse into the dielectric material and form a substantially uniform concentration within the dielectric material. The substantially uniform concentration comprises less than approximately 5% variation in a concentration of treating agent particles 108. FIG. 1B illustrates some embodiments of a self-repairing dielectric material 100B, wherein a non-porous cap material 110 is formed above the dielectric film 104. The non-porous cap material 110 comprises a pore size of essentially zero, such that the non-porous cap material 110 encapsulates the treating agent particles 108 within the dielectric film 104. In some embodiments the non-porous cap material 110 comprises a porous ultra low-k dielectric material such as oxygen-doped SiC (ODC), nitrogen-doped SiC (NDC), SiN, etc., comprising a dielectric constant value of less than approximately 2.4.

Figure 2A:
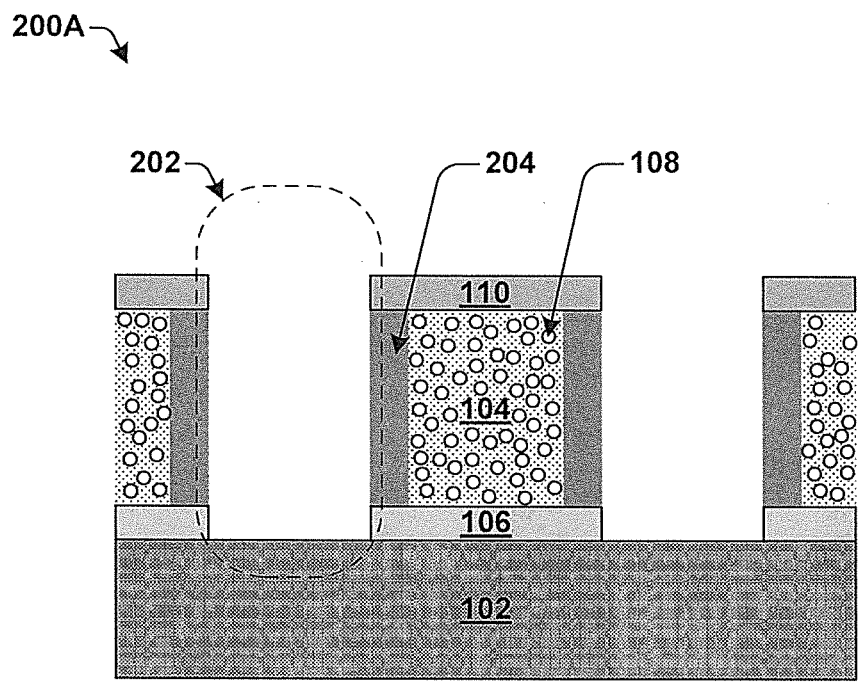

FIG. 2A illustrates some embodiments of a self-repairing dielectric material 200A. Openings 202 are formed in the dielectric film 104 by an etch and clean process (e.g., a plasma etch followed by a chemical clean), which introduces sidewall damage 204 within a surface region of the dielectric film 104. A chemical reaction is initiated between the treating agent particles 108 and the sidewall damage 204, essentially completely repairing the damage within the surface region for any depth. The chemical reaction my occur automatically as the sidewall damage 204 forms, or may be initiated by an activation process comprising a high-temperature process, ultra-violet cure, or other energy-transferring process.

For the embodiments of the self-repairing dielectric material 200A, the dielectric film 104 comprises a carbon containing $SiO_2$ film such as an SiCOH-based porous low-k dielectric material, comprising a dielectric constant value between approximately 2.4 and approximately 3.0, wherein carbon has been added to reduce the polarizability thus reducing a dielectric constant of the dielectric film 104. Subsequent processing steps such as plasma etching or ashing are found to cause depletion of carbon containing moieties within the surface region of the dielectric film 104, replacing Si=$CH_3$ bonds with Si=OH bonds. In porous low-k dielectric materials reactive etch and ash gases may diffuse further into the film, thus increasing the range of damage. For instance, when the dielectric film 104 is plasma etched with plasma containing Ar and free radicals such as O, F, N, H, Ar bombardment will break the chemical bond and form dangling bonds which react with the O, F, N, H free radicals and form volatile by-products. This also makes the surface of the dielectric film 104 become hydrophilic, pushing some fraction of the free radicals into the dielectric film 104. Damaged carbon will re-hydroxylate and hydrogen bond with water, which raises an effective dielectric constant of the dielectric film 104. Various thermal processes (e.g., high-temperature anneals) also promote condensation of adjacent Si=OH groups, increasing their density, and creating voids within the dielectric film 104. The treating agent particles 112 comprise a re-methylating compound which re-alkylates or re-arylates the damaged carbon, thus restoring the dielectric constant. An exemplary embodiment of the re-methylation process comprises an SiOH damaged surface reacted with $RxSi(OCOCH_3)y$ treating agent particles to yield a repaired surface of SiOSiRx. Replacing Si=OH bonds by Si=O=Si—Rx bonds avoids condensation reactions, and thus void formation. Other exemplary embodiments comprise treating agent particles which replenish carbon containing moieties within the dielectric film 104.

Figure 2B:
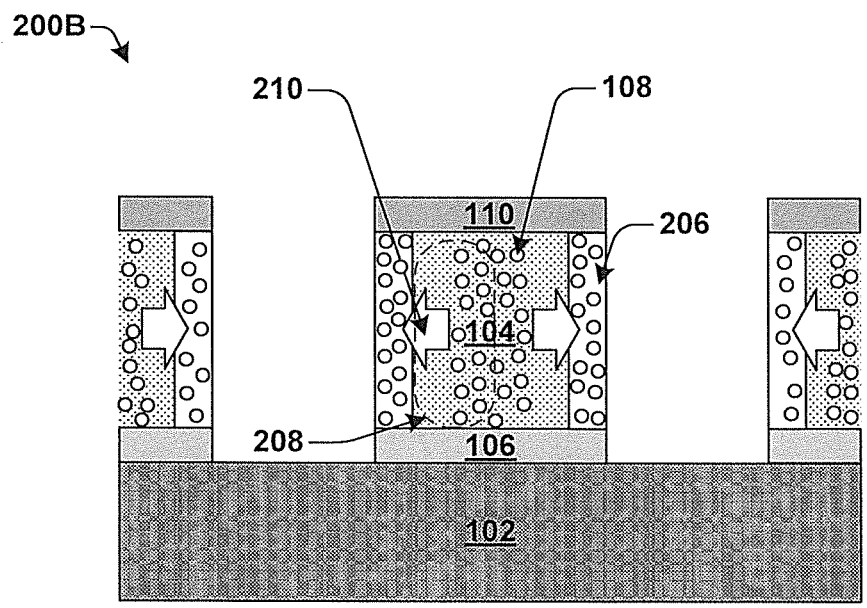

FIG. 2B illustrates some embodiments of a self-repairing dielectric material 200B. A chemical reaction initiated between the treating agent particles 108 and the sidewall damage which creates a repaired sidewall 206. The reaction of the treating agent particles 108 with the sidewall damage consumes the treating agent particles 108 and depletes their concentration within the surface region, resulting in a gradient concentration 208 of the treating agent particles 108 within the dielectric film 104, wherein a density of treating agent particles within the surface region of the dielectric film 104 is less than a density of treating agent particles 108 within a bulk region of the dielectric film 104, the bulk region comprising an interior region of the dielectric film 104 other than the surface region. The gradient concentration 208 of treating agent particles 108 results in continuous diffusion 210 of the treating agent particles from the bulk region of the dielectric film 104 to the surface region of the dielectric film 104. Moreover, the larger concentration of treating agent particles 112 within the bulk region of the dielectric film 104 will react with contaminant radicals which diffuse into the dielectric film 104.

Figures 3A, 3B:
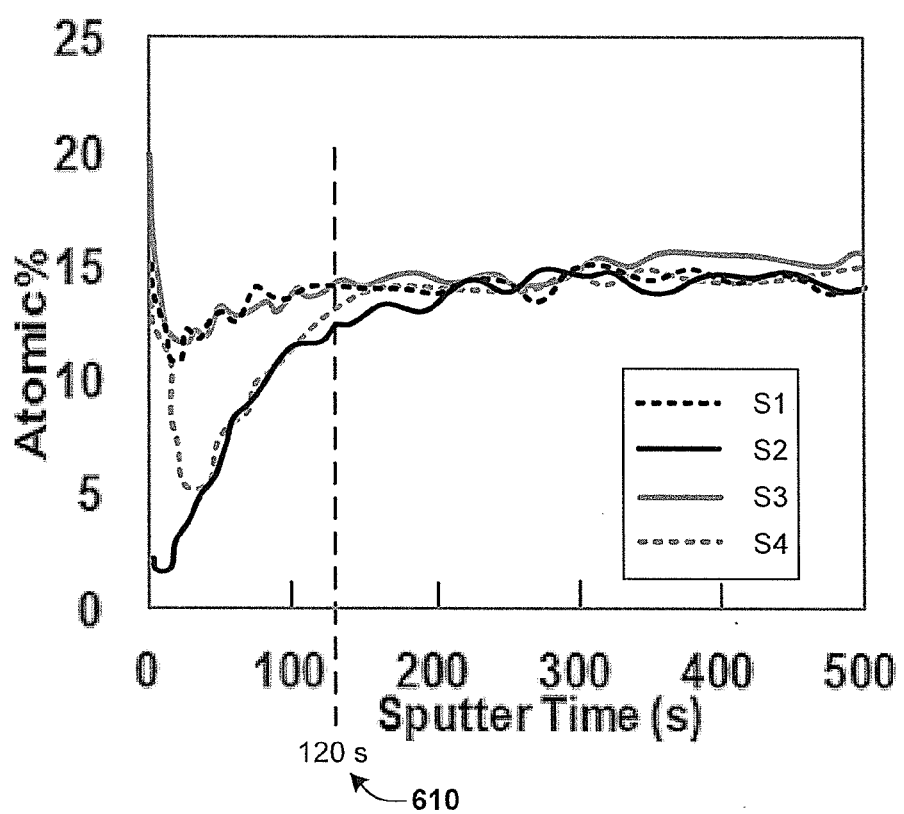
FIG. 3A illustrates a table describing four dielectric samples for XPS measurements of carbon concentration.
FIG. 3B illustrates a carbon depletion profile for some embodiments of self-repairing dielectrics vs. externally-repaired dielectrics.

To verify the effectiveness of the treating agent particles in increasing the concentration of carbon containing moieties within a dielectric material, a carbon concentration of the dielectric material may be measured by techniques such as Energy-dispersive X-ray spectroscopy (EDX) or X-ray Photoelectron Spectroscopy (XPS). FIG. 3A illustrates a table describing four dielectric material samples for XPS measurements of carbon concentration. S1 (602) is an untreated dielectric film. S2 (604) is an etched dielectric film with damage. S3 (606) is a self-repairing dielectric film produced by subjecting unpatterned dielectric film to a treating agent particle treatment and capping with a non-porous cap material prior to etching and ashing processes. S4 (608) is an externally-repaired dielectric film produced by subjecting an unpatterned dielectric film to etching and ashing processes followed by the treating agent particle treatment.

FIG. 3B illustrates a carbon depletion profile 300B for some embodiments of self-repairing dielectrics vs. externally-repaired dielectrics as measured by XPS, wherein the carbon concentration of Carbon (Atomic %) is shown as a function of sputter depth. In this non-limiting example a thickness of a damage region 610 is expressed as a sputter time of approximately 120 seconds. It will be appreciated from the concentration of Carbon given by S1-S4 (602-608) within the thickness of the damage region 610, that S3 (606) for a self-repairing dielectric film gives essentially the same behavior as S1 (602) for an untreated dielectric film (approximately less than a 5% maximum difference in carbon concentration for sputter times between approximately 0 seconds and 120 seconds), whereas for S4 (608) for externally-repaired dielectric film shows less carbon concentration in the same region (approximately greater than a 5% maximum difference in carbon concentration for sputter times between approximately 0 seconds and 120 seconds). Thus, for the embodiments of 300B the self-repairing dielectric film demonstrates increased carbon concentration as compared to the externally-repaired dielectric film. Although FIG. 3B is not meant to be representative of all sidewall repair processes of a low-k dielectric film in any way, it does tend to show that the proposed implementation for a self-repairing porous low-k dielectric film can provide significant improvement in carbon concentration within the region of sidewall damage compared to some prior art approaches.

Figure 4:
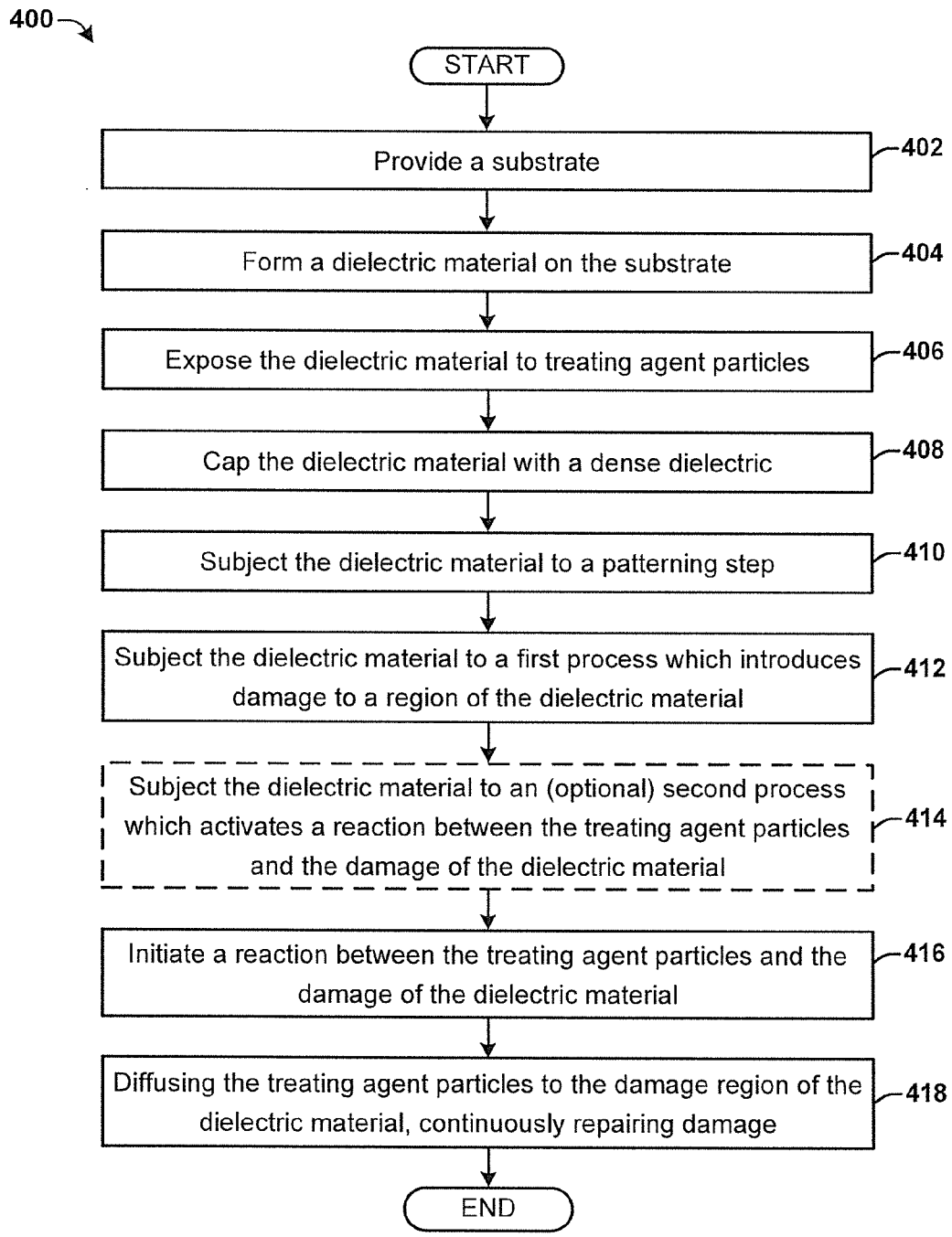
FIG. 4 illustrates a flow diagram of some embodiments of a method to create a self-repairing dielectric structure.

FIG. 4 illustrates a flow diagram of some embodiments of a method 400 to create a self-repairing dielectric structure. While method 400 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 402, a substrate is provided. The substrate comprises a silicon wafer or other semiconductor workpiece.

At 404, a dielectric material is formed on the substrate. The dielectric material comprises a porous low-k dielectric (e.g., $2.4 \leq k \leq 3.0$) or porous ultra low-k dielectric (e.g., $k<2.4$) formed by chemical vapor deposition (CVD) or spin on methods.

At 406, the dielectric material is exposed with treating agent particles such that the treating agent particles diffuse into the dielectric material and form a substantially uniform concentration within the dielectric material. The treating agent particles comprise re-methylating compound capable of re-alkylating or re-arylating the damaged carbon, with a treating agent particle size that is smaller than a first pore size of the dielectric material. The treating agent particles may further comprises at least one compound having a formula $[=SiR_2NR'=]_n$, where $n>2$ and may be cyclic; $R_3SiNR'SiR_3$, $(R_3Si)_3N$; $R_3SiNR'_2$; $R_2Si(NR')_2$; $RSi(NR')_3$; $R_xSiCl_y$, $R_xSi(OH)_y$; $R_3SiOSiR'_3$; $R_xSi(OR')_y$; $R_xSi(OCOR')_y$; $R_xSiH_y$; $R_xSi[OC(R')=R'']_{4-x}$ or combinations thereof, wherein x is an integer ranging from 1 to 3, y is an integer ranging from 1 to 3 such that x+y=4, each R is independently selected from hydrogen and a hydrophobic organic moiety; R' is hydrogen, or an organic moiety, and R" is an alkyl or carbonyl group.

At 408, dielectric material is capped with a dense low-k dielectric. The dense low-k dielectric comprises a non-porous dense low-k dielectric with a second pore size that is smaller than the treating agent particle size, encapsulating the treating agent particles within the dielectric material.

At 410, the dielectric material is subjected to a patterning step comprising coating of the dielectric material with photoresist, aligning the dielectric material with a patterning mask, and exposing the dielectric material to a radiation source. The radiation creates a pattern of developed photoresist corresponding to open regions of the photomask.

At 412, the dielectric material is subjected to a first process which introduces damage within a damage region within the dielectric material, the damage comprising a degradation to an electrical parameter of the dielectric material. The process comprises one or more of ashing, etching, wet or dry chemical cleaning, thermal cycling, or combinations thereof. The damage comprises a reduction in a concentration of carbon containing moieties within the damage region.

At 414, the dielectric material is subjected to a second process, which comprises an optional activation operation that promotes a reaction between the treating agent particles and the damage of the dielectric material. In some embodiments this reaction occurs automatically as the damage is formed. In other embodiments the reaction may be initiated or enhanced (e.g., faster reaction rate) by an activation operation which comprises a high-temperature process, ultra-violet cure, or other energy-transferring process.

At 416, a reaction is initiated between the treating agent particles and the damage of the dielectric material, wherein the reaction repairs the damage, restoring the electrical parameter to approximately its original value. The reaction comprises a chemical reaction between treating agent particles comprising a re-methylating compound which re-alkylates or re-arylates damaged carbon within a surface region of the dielectric material. The chemical reaction comprises consuming the treating agent particles within the damage region within the surface region of the dielectric material, resulting in a gradient concentration of the treating agent particles within the dielectric material. In some embodiments the reaction occurs simultaneously, while in other embodiments an activation energy is either required to initiate the reaction, or may enhance the reaction.

At 418, the gradient concentration of treating agent particles results in continuous diffusion the treating agent particles from the center of the dielectric material to the surface of the dielectric material, continuously repairing damage to the dielectric material.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein; such terms are intended to be inclusive in meaning-like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the present disclosure relates to a structure and method to create a self-repairing dielectric material for semiconductor device applications. The method of encapsulating treating agent particles within a porous dielectric material allows for continuous self-repair of damage induced on the surface during etching, as well as reacting with any contaminate radicals which may diffuse into dielectric material as a bi-product of etching. The method of encapsulating treating agent particles within a porous dielectric material prior to etching also reduces the number of processing steps required to repair the film, since the formation of the porous dielectric material and an exposure to treating agent particles may be performed in-situ in a single processing step, as opposed to multiple steps if the dielectric material is formed and repaired after etching.

In some embodiments, the present disclosure relates to a self-repairing dielectric structure. The self-repairing dielectric structure comprises a semiconductor workpiece, and a porous dielectric film disposed over the semiconductor workpiece and having a plurality of pores with a first pore size. The self-repairing dielectric structure further comprises a plurality of treating agent particles arranged within the porous dielectric film and having a size smaller than the first pore size. The plurality of treating agent particles are disposed in a gradient concentration having a first density of treating agent particles within a surface region of the porous dielectric film that is less than a second density of treating agent particles within a bulk region of the porous dielectric film.

In other embodiments, the present disclosure relates to an integrated chip. The integrated chip comprises a porous dielectric film disposed over a substrate and having a first plurality of pores with a first pore size, and a plurality of treating agent particles arranged within the porous dielectric film and having a size smaller than the first pore size. The integrated chip further comprises a cap material arranged onto the porous dielectric film and comprising a dielectric material having a second plurality of pores with a second pore size that is less than the size of the plurality of treating agent particles. The integrated chip further comprises a repaired region located on an outer surface of the porous dielectric film. The cap material abuts a first surface of the repaired region without abutting a second surface of the repaired region.

In other embodiments, the present disclosure relates to an integrated chip. The integrated chip comprises a porous dielectric film disposed over a metal interconnect layer and having a first plurality of pores with a first pore size, and a plurality of treating agent particles having a size smaller than the first pore size. The integrated chip further comprises a cap material located on an upper surface of the porous dielectric film, and comprising a dielectric material having a second plurality of pores with a second pore size that is smaller than the first pore size. The integrated chip further comprises a trench that vertically extends from a top surface of the cap material to a metal interconnect layer underlying the porous dielectric film, and that laterally abuts a repaired region of the porous dielectric film.

What is claimed is:

1. A self-repairing dielectric structure, comprising;
a semiconductor workpiece;
a porous dielectric film disposed over the semiconductor workpiece and having a plurality of pores with a first pore size, wherein the porous dielectric film has a surface region and a bulk region that is separated from sidewalls of the porous dielectric film by the surface region,
a repaired region located along the sidewalls of the porous dielectric film, wherein the surface region separates the bulk region from the repaired region; and
a plurality of treating agent particles arranged within the porous dielectric film and the repaired region and having a size smaller than the first pore size, wherein the plurality of treating agent particles are disposed in a gradient concentration having a first density of treating agent particles within the surface region of the porous dielectric film that is less than a second density of treating agent particles within the bulk region of the porous dielectric film.

2. The dielectric structure of claim 1, further comprising:
a cap material arranged onto the porous dielectric film and comprising a dielectric material having a second pore size that is less than the first pore size.

3. The dielectric structure of claim 2, further comprising:
a trench that vertically extends from a top surface of the cap material to a metal interconnect layer underlying the porous dielectric film, and that laterally abuts the repaired region of the porous dielectric film.

4. The dielectric structure of claim 2, wherein the cap material comprises oxygen-doped silicon carbide (SiC) or nitrogen-doped silicon carbide (SiC).

5. The dielectric structure of claim 4, wherein the porous dielectric film comprises a carbon containing silicon dioxide ($SiO_2$) film.

6. The dielectric structure of claim 1, wherein the first pore size is in a range of between approximately 11 angstroms and approximately 20 angstroms.

7. The dielectric structure of claim 1, wherein the gradient concentration of the plurality of treating agent particles causes a difference in carbon concentration within the porous dielectric film of approximately 5% between the surface region and the bulk region.

8. The dielectric structure of claim 1, wherein the plurality of treating agent particles comprise a re-methylating compound capable of re-alkylating or re-arylating a region within the porous dielectric film damaged by a plasma etching process.

9. The dielectric structure of claim 1, wherein the plurality of treating agent particles comprise at least one compound having a formula $[-SiR_2NR'-]_n$ where n>2 and may be cyclic; $R_3SiNR'SiR_3$, $(R_3Si)_3N$; $R_3SiNR'_2$; $R_2Si(NR)_2$; $RSi(NR')_3$; $R_xSiCl_y$, $R_xSi(OH)_y$; $R_3SiOSiR'_3$; $R_xSi(OR')_y$; $R_xSi(OCOR')_y$; $R_xSiH_y$; $R_xSi[OC(R')=R'']_{4-x}$ or combinations thereof, wherein x is an integer ranging from 1 to 3, y is an integer ranging from 1 to 3 such that x+y=4, each R is independently selected from hydrogen and a hydrophobic organic moiety, R' is hydrogen or an organic moiety, and R'' is an alkyl or carbonyl group.

10. An integrated chip, comprising:
a porous dielectric film disposed over a substrate and having a first plurality of pores with a first pore size;
a plurality of treating agent particles arranged within the porous dielectric film and having a size smaller than the first pore size;
a cap material arranged onto the porous dielectric film and comprising a dielectric material having a second plurality of pores with a second pore size that is less than the size of the plurality of treating agent particles; and
a repaired region located on an outer surface of the porous dielectric film and comprising a second plurality of treating agent particles, wherein the cap material abuts a first surface of the repaired region without abutting a second surface of the repaired region.

11. The integrated chip of claim 10, wherein the plurality of treating agent particles are disposed in a gradient concentration having a first density of treating agent particles within a surface region of the porous dielectric film that is less than a second density of treating agent particles within a bulk region of the porous dielectric film.

12. The integrated chip of claim 11, wherein the gradient concentration of the plurality of treating agent particles causes a difference in carbon concentration within the porous dielectric film of approximately 5% between the surface region and the bulk region.

13. The integrated chip of claim 10, wherein the cap material comprises oxygen-doped silicon carbide (SiC) or nitrogen-doped silicon carbide (SiC).

14. The integrated chip of claim 13, wherein the porous dielectric film comprises a carbon containing silicon dioxide ($SiO_2$) film.

15. The integrated chip of claim 10, further comprising:
a trench that vertically extends from a top surface of the cap material to a metal interconnect layer underlying the porous dielectric film, and that laterally abuts a repaired region of the porous dielectric film.

16. An integrated chip, comprising;
a porous dielectric film disposed over a metal interconnect layer and having a first plurality of pores with a first pore size;
a plurality of treating agent particles having a size smaller than the first pore size;
a cap material located on an upper surface of the porous dielectric film, and comprising a dielectric material having a second plurality of pores with a second pore size that is smaller than the first pore size;
a trench that vertically extends from a top surface of the cap material to the metal interconnect layer underlying the porous dielectric film, and that laterally abuts a repaired region of the porous dielectric film; and wherein the plurality of treating agent particles are disposed in a gradient concentration having a first density of treating agent particles within a surface region of the porous dielectric film that is less than a second density of treating agent particles within a bulk region of the porous dielectric film.

17. The integrated chip of claim 16, wherein the plurality of treating agent particles comprise $R_xSi(OCOCH_3)_y$ and the repaired region comprises $SiOSiR_x$.

18. The integrated chip of claim 16, wherein the plurality of treating agent particles comprise a re-methylating compound capable of re-alkylating or re-arylating a region within the porous dielectric film damaged by a plasma etching process.

19. The integrated chip of claim 16, wherein the cap material comprises oxygen-doped silicon carbide (SiC) or nitrogen-doped silicon carbide (SiC).

20. The integrated chip of claim 16, wherein the plurality of treating agent particles are present within sections of the porous dielectric film that have not been previously damaged.

* * * * *